United States Patent
Kintis et al.

(10) Patent No.: US 7,542,735 B2
(45) Date of Patent: Jun. 2, 2009

(54) MULTI-OCTAVE DIFFERENTIAL UPCONVERTER

(75) Inventors: Mark Kintis, Manhattan Beach, CA (US); Flavia S. Fong, Monterey Park, CA (US); Alan Cherrette, Hermosa Beach, CA (US); Edward V. Koretzky, Hawthorne, CA (US); Juan Rivera, Torrance, CA (US); Gregory H. Rowan, Redondo Beach, CA (US); Derrick M. Yamauchi, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 470 days.

(21) Appl. No.: 11/584,276

(22) Filed: Oct. 20, 2006

(65) Prior Publication Data

US 2008/0096498 A1     Apr. 24, 2008

(51) Int. Cl.
  *H04B 1/04* (2006.01)
(52) U.S. Cl. .................................... 455/114.1; 455/118
(58) Field of Classification Search .................. 455/91, 455/95, 108, 109, 110, 112, 114.1, 115.1, 455/118, 119, 114.2
See application file for complete search history.

(56) References Cited

U.S. PATENT DOCUMENTS

| 6,996,379 | B2* | 2/2006 | Khorram | 455/91 |
| 2008/0064344 | A1* | 3/2008 | Kuo et al. | 455/118 |
| 2008/0139139 | A1* | 6/2008 | Pan | 455/114.2 |

* cited by examiner

*Primary Examiner*—Thanh C Le
(74) *Attorney, Agent, or Firm*—Patti, Hewitt & Arezina LLC

(57) ABSTRACT

An apparatus in one example comprises a differential amplifier and a differential mixer. The differential amplifier is configured to receive a multi-octave differential input signal and output an amplified multi-octave differential output signal. The differential amplifier is also configured to substantially reduce second order harmonic distortion of the amplified multi-octave differential output signal through common mode rejection. The differential mixer configured to multiply the amplified multi-octave differential output signal with a local oscillator input signal and output an up-converted sub-octave differential output signal. The multi-octave differential input signal and the up-converted sub-octave differential output signal comprise a substantially same bandwidth.

24 Claims, 2 Drawing Sheets

MULTI-OCTAVE DIFFERENTIAL UPCONVERTER

TECHNICAL FIELD

The invention relates generally to radio-frequency (RF) communications systems. More particularly, this invention relates to reduction in harmonic distortion of wideband RF signals.

BACKGROUND

Many RF communications systems in use today require wide spectra. It is not uncommon for some systems to have RF signals that have a bandwidth ratio of more than 2:1. If the RF signals in such a system need to be up-shifted or up-converted in frequency, the RF signals are usually up-converted by heterodyning them (multiplying) by another signal at a higher or lower frequency.

One problem associated with wideband signals (e.g., signals with a bandwidth of more than one octave) for RF communication systems is the generation of second order distortion (e.g., second order spurs). For a first signal of fundamental frequency $f_1$, second order spurs of intermodulation distortion (IM2) may be created by 1) $2^{nd}$ order harmonics of the first signal at twice the frequency (i.e., $2f_1$) and/or 2) mixing the first signal with a second signal of fundamental frequency $f_2$, where the spurs occur at frequencies of f1-f2 or f1+f2.

One way to improve second order distortion of an amplifier is to increase its DC power. However, increasing the DC power will increase thermal energy dissipation, which may cause problems in the system such as overheating of electrical components. Thermal energy dissipation may be an important system design consideration for phased array systems where many active electronics are used.

As used herein, a "differential signal" is a signal that propagates through pairs of conductors. At any given instant, the voltages on a pair of conductors carrying a differential signal are equal in amplitude but opposite in polarity. For example, the signals on conductors carrying a differential signal are equal and opposite to each other such that the algebraic sum of the signals on the two conductors is substantially equal to zero. A "differential signal" is also known in the art as a "common mode" or a "double-ended signal" signal. A "single-ended" signal on the other hand is one that travels along a conductor where the voltage on the conductor swings above and below zero volts. Single-ended signals are therefore normally measured with respect to a reference or ground potential whereas a differential signal is measured or referenced with respect to its paired signal conductor.

Differential electronics may provide cancellation (20 to 30 dB is typical) of second order distortion. Examples of differential electronics comprise a push-pull or differential amplifier. Baluns are widely used in electrical and electronic engineering for the purpose of converting a balanced input to an unbalanced output or vice versa. In radio frequency (RF) and microwave monolithic integrated circuits (MMICs), baluns may be used for designing, for example, push-pull low-noise amplifiers (LNA) or double balanced mixers. The magnitude of the second order spur cancellation is dependent upon amplitude and phase errors due to baluns used in the differential electronics. As is well-known, it is very difficult to design a wideband MMIC balun with a bandwidth ratio higher than (3:1) with good phase and amplitude balance. As is well-known, a wideband balun has a higher insertion loss, which will degrade a Noise Figure (NF) of the system if it is used at the input. In addition, the size of the multi-octave balun is usually large.

As is known in the art, multiplication of a first input sine (or cosine) wave with frequency $f_1$ with a second input sine (or cosine) wave with frequency $f_2$ yields two output sine wave signals, for example, first and second output sine waves (or cosine). A frequency of the first output sine wave is equal to a sum of the first and second input sine waves. A frequency of the second output sine wave is equal to a difference between the first and second input sine waves. For example, where the first input comprises an RF signal at 100 MHz and the second input comprises an RF signal at 2.0 GHz, the first output signal comprises a frequency of 2.1 GHz and the second output signal comprises a frequency of 1.9 GHz.

In a wideband communication system, such as one that uses signals between 100 MHz. and 1.0 GHz., a prior art method for suppressing harmonics in up-converted signals is to split a wide baseband spectrum into several different slices or ranges. For example, 100 MHz. to 200 MHz., 200 MHz to 300 MHz., 300 MHz.-400 MHz., etc. Since each band pass filter will allow only a portion of the RF to pass, each filter will suppress $2^{nd}$, $3^{rd}$ etc. harmonic signals that might be present in the RF signal.

The output of each band-pass filter is summed together to produce a reasonably close facsimile of the RF signal. Note that the above filtering of the spectrum into multiple slices may or may not be followed by frequency translation.

One unavoidable problem with using band-pass filters is that each filter will have at least some "roll-off" at each of end of its nominal pass band. RF signals at or near the cut-off frequencies of a filter will be somewhat attenuated. If a RF signal at or near a filter's cut-off frequency is weak, the attenuation caused by the filter's roll-off might cause the signal to be lost. Put another way, when multiple filters are used to split up a wide spectrum into discrete slices, the filter roll-off of each filter will cause the resultant signal (which may or may not be frequency translated) to have "blind spots" that are centered at each base-band filter's nominal cut-off frequencies. Because the "blind spots" caused by separate band-pass filters are unusable, their bandwidth is wasted. As the demand for RF communications grows, RF spectrum becomes more precious.

Even if blind spots were not a problem, using such a method requires additional costs associated with having to use multiple filters, multiple amplifiers, and multiple mixers. As is well-known, as parts count increases, size, weight, and cost also increase.

SUMMARY

The invention in one implementation encompasses an apparatus. The apparatus comprises a differential amplifier and a differential mixer. The differential amplifier is configured to receive a multi-octave differential input signal and output an amplified multi-octave differential output signal. The differential amplifier is also configured to substantially reduce second order harmonic distortion of the amplified multi-octave differential output signal through common mode rejection. The differential mixer configured to multiply the amplified multi-octave differential output signal with a local oscillator input signal and output an up-converted sub-octave differential output signal. The multi-octave differential input signal and the up-converted sub-octave differential output signal comprise a substantially same bandwidth.

The invention in another implementation encompasses a method. A multi-octave differential input signal is received from a differential input source. The multi-octave differential input signal is amplified with a fully differential amplifier to obtain an amplified multi-octave differential output signal. The amplified multi-octave differential output signal is upconverted to obtain an up-converted sub-octave differential output signal. The multi-octave differential input signal and the up-converted sub-octave differential output signal comprise a substantially same bandwidth.

The invention in yet another implementation encompasses an apparatus. The apparatus comprises a differential mixer configured to perform a frequency downconversion of a sub-octave input signal and output a multi-octave differential signal. The apparatus further comprises a differential amplifier configured to amplify the multi-octave differential signal to produce an amplified differential signal. The sub-octave input signal, the multi-octave differential signal, and the amplified differential signal comprise a substantially same bandwidth.

DESCRIPTION OF THE DRAWINGS

Features of the invention will become apparent from the description, the claims, and the accompanying drawings in which:

DETAILED DESCRIPTION

In the field of wideband RF communications, harmonic interference is often the limiting factor in dynamic range. The effects of harmonic interference in one example are significantly reduced via wideband differential frequency conversion. This enables much better dynamic range at significantly reduced system complexity (and associated size, weight, power, and cost).

Figure 1:
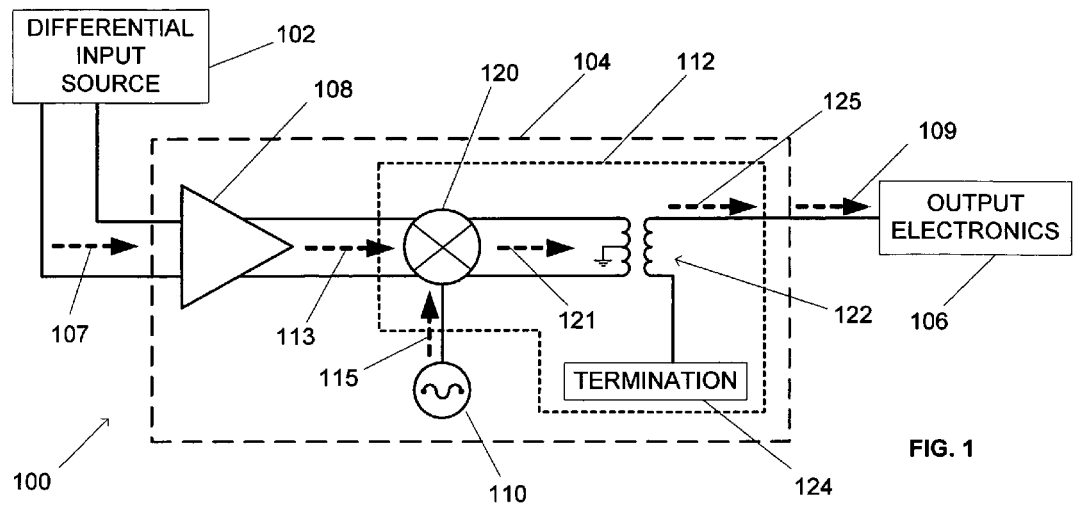
FIG. 1 is a schematic representation of one implementation of an apparatus that comprises a differential input source, a differential upconverter, and output electronics.

Turning to FIG. 1, an apparatus 100 in one embodiment comprises a differential input source 102, a differential upconverter 104, and output electronics 106. The differential input source 102 is configured to output a multi-octave differential signal, for example, multi-octave differential input signal 107. The differential input source 102 in one embodiment comprises a differential antenna that is configured to output the multi-octave differential input signal 107. For example, the differential input source 102 comprises a dipole antenna. In another embodiment, the differential input source 102 comprises an antenna that is configured to output a multi-octave single-ended signal. In this embodiment, the differential input source 102 comprises a differential converter (not shown) that is configured to convert the multi-octave single-ended signal into the multi-octave differential input signal 107. For example, this can be implemented by using wideband input balun.

The differential upconverter 104 in one example comprises a differential amplifier 108, a local oscillator 110, and a differential mixer 112. The differential upconverter 104 in one example comprises a multi-octave differential upconverter that is configured to upconvert the multi-octave differential input signal 107 and output a sub-octave signal 109, as described herein. The differential amplifier 108 is coupled with the differential input source 102 to receive the multi-octave differential input signal 107. The differential amplifier 108 in one example comprises a low noise amplifier (LNA). The differential amplifier 108 is configured to amplify the multi-octave differential input signal 107 and output an amplified multi-octave differential output signal 113. In one example, the differential amplifier 108 comprises a fully differential amplifier. For example, the differential amplifier 108 receives a differential signal and outputs a differential signal. The differential amplifier 108 in one example substantially reduces second order harmonic distortion in the amplified multi-octave differential output signal 113 through common mode rejection, as will be appreciated by those skilled in the art.

The local oscillator 110 is configured to generate a local oscillator input signal 115. In one embodiment, the local oscillator input signal 115 comprises a differential signal. In another embodiment, the local oscillator input signal 115 comprises a single-ended signal. The local oscillator input signal 115 in one example comprises a fixed or predetermined frequency. The local oscillator 110 in one example comprises a converter (not shown) to generate the local oscillator input signal 115 as a single-ended signal or differential signal, as will be appreciated by those skilled in the art.

The differential mixer 112 in one embodiment comprises a mixer component 120. The mixer component 120 is configured to multiply the amplified multi-octave differential output signal 113 from the differential amplifier 108 with the local oscillator input signal 115 from the local oscillator 110. The local oscillator input signal 115 in one example comprises a higher frequency than the amplified multi-octave differential output signal 113. The differential mixer 112 effectively upconverts the amplified multi-octave differential output signal 113 and outputs an up-converted sub-octave differential output signal 121. The differential mixer 112 in one example outputs the up-converted sub-octave differential output signal 121 to the output electronics 106. In this embodiment, the up-converted sub-octave differential output signal 121 comprises the sub-octave signal 109.

In another embodiment, the differential mixer 112 comprises the mixer component 120, a balun 122, and a termination 124. The mixer component 120 outputs the up-converted sub-octave differential output signal 121 to the balun 122. Examples of the balun 122 comprise a Marchand balun, a spiral balun, and a coaxial balun. In one example, the differential mixer 112 and the balun 122 comprise an integral component. The balun 122 is configured to convert the up-converted sub-octave differential output signal 121 into a sub-octave single-ended output signal 125. In this embodiment, the sub-octave single-ended output signal 125 comprises the sub-octave signal 109. The balun 122 comprises a differential input and single-ended output. For example, one output end of the balun 122 is coupled with the termination 124. The termination 124 in this example may comprise a short to ground, a resistance path to ground (e.g., fifty ohms), or a reference voltage source. In a further example, the balun 122 comprises a sub-octave balun. The sub-octave balun is an easier design compared to a multi-octave balun, as will be appreciated by those skilled in the art.

The differential upconverter 104 in one embodiment upconverts an entire band of the multi-octave differential input signal 107 into the sub-octave signal 109 in a single step. For example, the differential upconverter 104 performs full band differential upconversion to a sub-octave intermediate frequency (IF) band to provide second order harmonic cancellation for each octave within the multi-octave differential input signal 107. In this embodiment, the differential upconverter 104 does not divide the multi-octave differential input signal 107 into separate sub-bands and perform separate amplification and upconversion, followed by recombination for the output signal (e.g., one amplifier/upconversion step per sub-band). Recombination typically requires additional multiplexers and filters and may degrade performance near crossover points of the multiplexers. As is known in the art, dividing into sub-bands requires additional electronics and filters. By using a single stage and not dividing the multi-octave signal into sub-bands, the differential upconverter 104 in this embodiment uses fewer electronic components, as will be appreciated by those skilled in the art.

The differential amplifier 108 and differential mixer 112 in one example are configured to form a push-pull topology for the differential upconverter 104. For example, the differential upconverter 104 comprises differential paths that add in phase at a fundamental frequency, but are out of phase at the second order harmonic. As will be appreciated by those skilled in the art, a push-pull topology substantially reduces even-numbered harmonics (e.g., the second order harmonic).

The differential upconverter 104 in one embodiment is formed partially or entirely as a monolithic microwave integrated circuit (MMIC). For example, one or more of the differential amplifier 108, the local oscillator 110, and/or the mixer component 112 are formed as one or more separate MMICs, or as a single MMIC to enhance amplitude and phase balance in the differential path. In another embodiment, the local oscillator 110 is remotely located from the differential mixer 112. In a further example, the local oscillator 110 is separate from the differential upconverter 104.

The output electronics 106 in one embodiment comprises an antenna, beam forming network, or phased array subsystem. The output electronics 106 may further comprise a single-ended or differential power amplifier before the antenna. In another embodiment, the output electronics 106 comprises a demodulator or intermediate frequency (IF) processor. In one example, the output electronics 106 is coupled with the differential mixer 112 and configured to receive a differential signal, for example, the up-converted sub-octave differential output signal 121. In another example, the output electronics 106 is coupled with the balun 122 and configured to receive the sub-octave single-ended output signal 125. The output electronics 106 in one example comprises a simpler design when configured to receive a sub-octave signal, such as the up-converted sub-octave differential output signal 121 or the sub-octave single-ended output signal 125, as will be appreciated by those skilled in the art. Where the differential input source 102 comprises an antenna, the differential antenna, the differential amplifier 108, and the differential mixer 112 in one example form a radio receiver.

Figure 3:
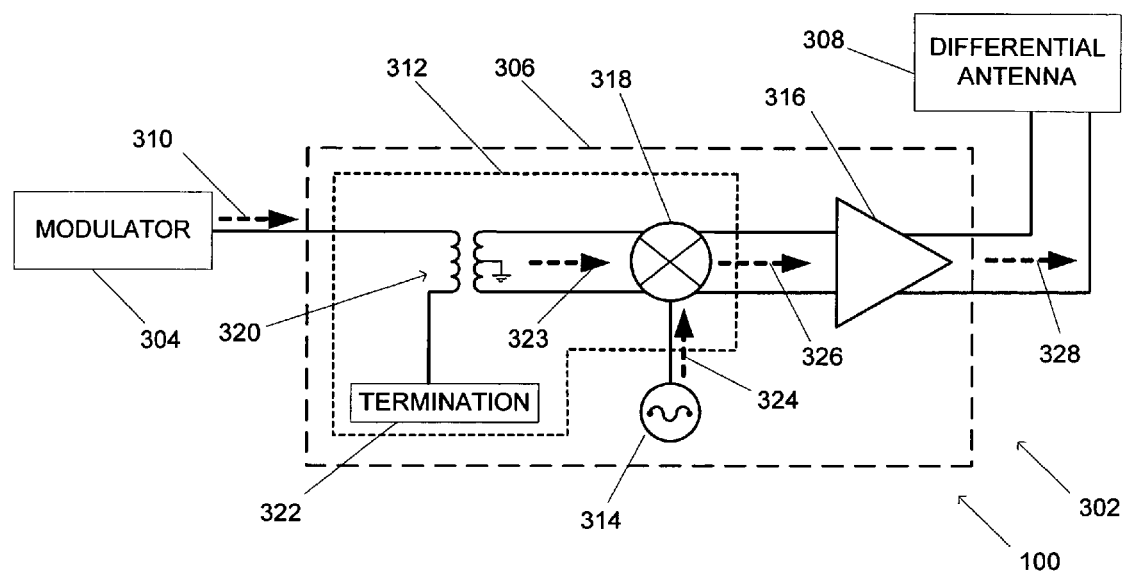
FIG. 3 is a representation of one implementation of a radio transmitter that comprises a modulator, a differential downconverter, and a differential antenna.

Turning to FIG. 3, the apparatus 100 in another embodiment comprises a radio transmitter 302. The radio transmitter 302 in one example comprises a modulator 304, a differential downconverter 306, and a differential antenna 308. The modulator 304 in one example receives an information-bearing signal and modulates the information-bearing signal on a high frequency carrier signal. For example, the modulator 304 directly upconverts the information-bearing signal to create an upconverted signal 310 with sub-octave bandwidth. In one example, the modulator 304 outputs the upconverted signal 310 as a differential output signal. In another example, the modulator 304 outputs the upconverted signal 310 as a single-ended output signal.

The differential downconverter 306 in one example comprises a differential mixer 312, a local oscillator 314, and a differential amplifier 316. The differential mixer 312 receives the upconverted signal 310 from the modulator 304. The differential mixer 312 comprises a mixer component 318. In one example, the differential mixer 312 further comprises an input balun 320 and termination 322. For example, where the upconverted signal 310 comprises the single-ended output signal, the input balun 320 and termination 322 convert the single-ended output signal to a sub-octave differential signal 323. Where the upconverted signal 310 comprises the differential output signal, the sub-octave differential signal 323 comprises the upconverted signal 310, as will be appreciated by those skilled in the art.

The differential mixer 318 receives the sub-octave differential signal 323 (e.g., from the input balun 320 or the modulator 304) and mixes the sub-octave differential signal 323 with a local oscillator input 324 from the local oscillator 314. For example, the differential mixer 318 performs a frequency downconversion of the sub-octave differential signal 323 and outputs a multi-octave differential signal 326. In this way, a filter for harmonic rejection is not needed, as will be appreciated by those skilled in the art. The local oscillator 314 in one example provides the local oscillator input 324 as a single-ended input which the mixer component 318 converts to a differential input. In another example, the local oscillator 314 providers the local oscillator input 324 as a differential input and the conversion is not required. The multi-octave differential signal 326 in one example comprises a frequency that is equal to a difference of a frequency of the sub-octave differential signal 323 and a frequency of the local oscillator input 324, preserving substantially the entire bandwidth of the sub-octave differential signal 323, but translated to a multi-octave frequency range. The multi-octave differential signal 326 from the differential mixer 312 is coupled to the differential amplifier 316, which produces an amplified differential signal 328. The differential amplifier 316 sends the amplified differential signal 328 to the differential antenna 308 for transmission of the amplified differential signal 328.

An illustrative description of operation of the apparatus 100 is presented, for explanatory purposes. Amplification of a signal typically causes artifacts such as harmonics. As is known in the art, a second order harmonic is generally the most significant harmonic. For a signal with a multi-octave range, for example, a broadband or wideband radio frequency (RF) signal, interference may be caused by harmonics of one portion of the signal overlapping with another portion of the signal.

Referring to FIG. 1, the multi-octave differential input signal 107 in one example comprises a frequency range of 100 to 800 MHz and the local oscillator input signal 115 comprises a frequency of 2000 MHz. If a first desired signal is at 400 MHz, a second signal at 200 MHz could create a second order harmonic which would also be at 400 MHz, interfering with the first desired signal. The differential amplifier 108 in one example substantially reduces the second order harmonic of the amplified multi-octave differential output signal, as compared to a single-ended amplifier.

The differential mixer 112 multiplies the amplified multi-octave differential output signal 113 (e.g., at 100-800 MHz) with the local oscillator input signal 115 (e.g., at 2000 MHz) to create the up-converted sub-octave differential output signal 121. The up-converted sub-octave differential output signal 121 in this example comprises a frequency range between 2100 MHz and 2800 MHz, as will be appreciated by those skilled in the art. Accordingly, the first desired signal (e.g., at 400 MHz) is translated to 2400 MHz and the second signal is translated to 2200 MHz. As a result of the upconversion, the multi-octave differential input signal 107 is translated into a sub-octave signal. The second order harmonic of the second signal is now at 4400 MHz and no longer interferes with the first desired signal at 2400 MHz. In this example, the sub-octave bandwidth has no issue with second order harmonics since the harmonic is out of band.

In one embodiment, the balun 122 receives the up-converted sub-octave differential output signal 121. The balun 122 in one example comprises an input bandwidth substantially equal to a bandwidth of the up-converted sub-octave differential output signal 121, for example, a bandwidth of 800 MHz. In another example, the input bandwidth of the balun 122 is slightly larger than the bandwidth of the up-converted sub-octave differential output signal 121, but small enough to exclude the range of the second order harmonics. The balun 122 in this embodiment does not allow the second order harmonics to pass through to the sub-octave single-ended output signal 125. In a further example, the balun 122 may reduce the second order harmonics by causing them to be out of phase, as will be appreciated by those skilled in the art.

The differential upconverter 104 upconverts the multi-octave differential input signal 107 into the sub-octave signal 109 (e.g., the up-converted sub-octave differential output signal 121 or the sub-octave single-ended output signal 125). By upconverting the multi-octave differential input signal 107 into a sub-octave band, the differential upconverter 104 in one example reduces second order distortion requirements for the output electronics 106. In a further example, the second order distortion requirements are only on differential amplifier 108 and the differential mixer 112. The multi-octave differential input signal 107 in one example comprises a same bandwidth as the up-converted sub-octave differential output signal 121 and/or the sub-octave single-ended output signal 125.

The differential input source 102, differential amplifier 108, differential mixer 112 (e.g., the mixer component 120 and the sub-octave balun 122) in one example form a push-pull LNA/mixer topology for a communication system to further reduce second order distortion. Where the differential input source 102 comprises a differential antenna (e.g., a dipole configuration) then the input wideband balun is not needed, which improves Noise Figure performance of the communication system. The differential antenna, the differential amplifier 108, and the differential mixer 112 in this example comprise a full band differential upconversion. The combination of the differential input signal (e.g., being driven by the multi-octave differential input signal 107 from the differential input source 102) and push-pull topology in one example makes the second order harmonic distortion requirements more realizable and makes design implementation much easier, as will be appreciated by those skilled in the art.

The process of multiplying (e.g., heterodyning) signals such as sine waves yields both sum and difference frequencies, as will be understood by those skilled in the art. In the above examples, the differential mixer 112 selects the sum frequencies. For example, the 100 MHz to 800 MHz RF signal is multiplied with the local oscillator input signal at 2000 MHz to obtain the 2100 MHz to 2800 MHz signal. In alternative embodiments, the differential mixer 112 may select the difference frequencies, for example, the frequencies of 1200 MHz to 1900 MHz.

Figure 2:
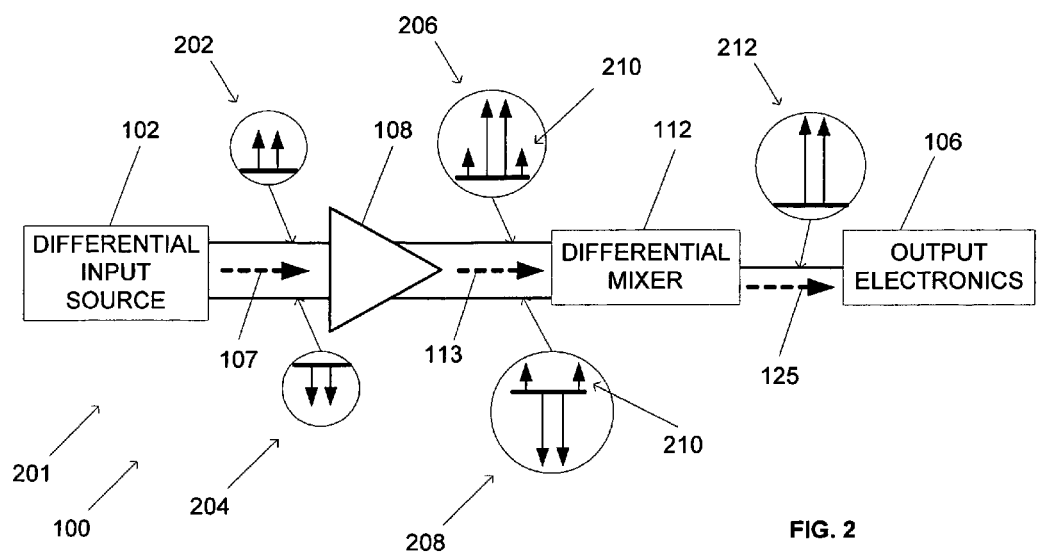
FIG. 2 is a representation of a signal flow through one implementation of the apparatus of FIG. 1.

Turning to FIG. 2, one embodiment of the differential upconverter 104 comprises a signal flow 201. In this embodiment, the differential mixer 112 comprises the balun 122 and termination 124 of FIG. 1 (not shown for clarity) and sends the sub-octave single-ended output signal 125 to the output electronics 106. The multi-octave differential input signal 107 comprises a first set of fundamental signals 202 and a second set of fundamental signals (equal in amplitude but 180 deg out of phase) 204 carried over a pair of conductors from the differential input source 102 to the differential amplifier 108. The amplified multi-octave differential output signal 113 comprises a third set of signals 206 and a fourth set of signals 208 (fundamental signals are still 180 degree out of phase from the 206 signals) with second order distortion spurs including second order harmonics 210 are all in phase. The differential mixer 112 upconverts the amplified multi-octave differential output signal 113 to obtain the sub-octave single-ended output signal 125. As the amplified multi-octave differential output signal 113 passes through the 180 deg sub-octave balun of the mixer, the two set of fundamental signals from 206 and 208 are added in phase while the $2^{nd}$ order distortion spurs are completely cancelled out. The sub-octave single-ended output signal 125 comprises a fifth signal 212 where the second order spurs are cancelled out perfectly. In an alternative embodiment, a pair of conductors carry the up-converted sub-octave differential output signal 121 to the output electronics 106 instead of the sub-octave single-ended output signal 125, as will be appreciated by those skilled in the art.

Although various implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
    a differential amplifier configured to receive a multi-octave differential input signal and output an amplified multi-octave differential output signal, wherein the differential amplifier is configured to substantially reduce second order harmonic distortion of the amplified multi-octave differential output signal through common mode rejection;
    a differential mixer configured to multiply the amplified multi-octave differential output signal with a local oscillator input signal and output an up-converted sub-octave differential output signal;
    wherein the multi-octave differential input signal and the up-converted sub-octave differential output signal comprise a substantially same bandwidth.

2. The apparatus of claim 1, further comprising:
    a balun configured to convert the up-converted sub-octave differential output signal to a sub-octave single-ended output signal;
    wherein the sub-octave single-ended output signal comprises a substantially same bandwidth as the multi-octave differential input signal.

3. The apparatus of claim 2, wherein the balun comprises a sub-octave balun.

4. The apparatus of claim 3, wherein sub-octave balun is coupled with a sub-octave beam forming network;
    wherein the sub-octave balun sends the sub-octave single-ended output signal to the sub-octave beam forming network.

5. The apparatus of claim 2, wherein the balun comprises one of a spiral balun, Marchand balun, or coaxial balun.

6. The apparatus of claim 2, wherein the differential mixer and the balun comprise an integral component.

7. The apparatus of claim 2, wherein the differential amplifier, the differential mixer, and the balun are configured as a monolithic microwave integrated circuit.

8. The apparatus of claim 1, wherein the local oscillator input signal comprises a differential local oscillator input signal.

9. The apparatus of claim 1, wherein the local oscillator input signal comprises a single-ended local oscillator input signal.

10. The apparatus of claim 1, wherein the local oscillator input signal comprises a fixed frequency or tunable frequency range.

11. The apparatus of claim 1, wherein differential mixer is coupled with a beam forming network, intermediate frequency (IF) processor, or demodulator;
wherein the differential mixer is configured to send the up-converted sub-octave differential output signal to the beam forming network or demodulator.

12. The apparatus of claim 1, further comprising:
a differential antenna coupled with the differential amplifier;
wherein the differential antenna is configured to generate and send the multi-octave differential input signal to the differential amplifier;
wherein the differential antenna, the differential amplifier, and the differential mixer form a radio receiver.

13. The apparatus of claim 12, wherein the differential antenna, the differential amplifier, and the differential mixer comprise a full band differential upconversion push-pull configuration.

14. The apparatus of claim 1, further comprising:
a single-ended antenna coupled with a differential conversion component;
wherein the single-ended antenna is configured to generate a single-ended multi-octave output signal;
wherein the differential conversion component is configured to convert the single-ended multi-octave output signal into the multi-octave differential input signal;
wherein the single-ended antenna, the differential amplifier, and the differential mixer form a radio receiver.

15. The apparatus of claim 1, wherein the differential amplifier comprises a fully differential amplifier;
wherein the differential mixer comprises a fully differential mixer.

16. A method, comprising the steps of:
receiving a multi-octave differential input signal from a differential input source;
amplifying the multi-octave differential input signal with a fully differential amplifier to obtain an amplified multi-octave differential output signal;
upconverting the amplified multi-octave differential output signal to obtain an up-converted sub-octave differential output signal, wherein the multi-octave differential input signal and the up-converted sub-octave differential output signal comprise a substantially same bandwidth.

17. The method of claim 16, wherein the step of upconverting the amplified multi-octave differential output signal to obtain the up-converted sub-octave differential output signal comprises the step of:
multiplying the amplified multi-octave differential output signal with a local oscillator input signal by a fully differential mixer.

18. The method of claim 16, further comprising the step of:
converting the up-converted sub-octave differential output signal to a sub-octave single-ended output signal through employment of a sub-octave balun, wherein the sub-octave single-ended output signal comprises a substantially same bandwidth as the multi-octave differential input signal.

19. The method of claim 18, further comprising the step of:
sending the sub-octave singled-ended output signal to a sub-octave beam forming network.

20. The method of claim 16, wherein the step of receiving the multi-octave differential input signal from the differential input source comprises the step of:
receiving the multi-octave differential input signal from a differential antenna.

21. An apparatus, comprising:
a differential mixer configured to perform a frequency downconversion of a sub-octave input signal and output a multi-octave differential signal; and
a differential amplifier configured to amplify the multi-octave differential signal to produce an amplified differential signal;
wherein the sub-octave input signal, the multi-octave differential signal, and the amplified differential signal comprise a substantially same bandwidth.

22. The apparatus of claim 21, further comprising:
a modulator configured to upconvert an information-bearing signal on a high frequency carrier signal with sub-octave bandwidth to create the sub-octave input signal; and
a differential antenna;
wherein the differential amplifier is configured to send the amplified differential signal to the differential antenna for transmission of the amplified differential signal.

23. The apparatus of claim 22, wherein the modulator is configured to create a single-ended input signal that comprises the sub-octave input signal;
wherein the differential mixer comprises an input balun and a termination configured to convert the single-ended input signal to a differential input signal that comprises the sub-octave input signal;
wherein the differential mixer performs the frequency downconversion of the differential input signal and outputs the multi-octave differential signal.

24. The apparatus of claim 21, wherein the multi-octave differential signal comprises a frequency that is equal to a difference of a frequency of the sub-octave differential signal and a frequency of a local oscillator input.

* * * * *